United States Patent [19]

Dandekar

[11] Patent Number: 5,206,531
[45] Date of Patent: Apr. 27, 1993

[54] SEMICONDUCTOR DEVICE HAVING A CONTROL GATE WITH REDUCED SEMICONDUCTOR CONTACT

[75] Inventor: Niru V. Dandekar, Nashua, N.H.
[73] Assignee: Lockheed Sanders, Inc., Nashua, N.H.
[21] Appl. No.: 672,197
[22] Filed: Mar. 19, 1991

Related U.S. Application Data

[63] Continuation-in-part of Ser. No. 495,877, Mar. 19, 1990, abandoned.

[51] Int. Cl.$^5$ ............................... H01L 29/812
[52] U.S. Cl. .................... 257/270; 257/284; 257/285; 257/286; 257/287
[58] Field of Search ............... 357/22 E, 22 I, 22 K, 357/15, 22 C

[56] References Cited

U.S. PATENT DOCUMENTS

| | | | |
|---|---|---|---|
| 3,448,349 | 6/1969 | Sumner | 357/22 |
| 4,065,782 | 12/1977 | Gray et al. | 357/22 |
| 4,112,455 | 9/1978 | Seliger et al. | 357/22 |
| 4,213,840 | 7/1980 | Omori et al. | 357/22 |
| 4,249,190 | 2/1981 | Cho | 357/22 |
| 4,463,366 | 7/1984 | Ishii et al. | 357/22 |
| 4,611,184 | 9/1986 | Kumar | 357/22 |
| 4,774,200 | 9/1988 | Nakajima et al. | 357/22 |
| 4,870,478 | 9/1989 | Weitzel et al. | 357/22 |

FOREIGN PATENT DOCUMENTS

| | | | |
|---|---|---|---|
| 0225566 | 11/1986 | European Pat. Off. | |
| 57-27073 | 2/1982 | Japan | 357/22 E |
| 60-257577 | 12/1985 | Japan | |
| 61-99381 | 5/1986 | Japan | |
| 63-232373 | 9/1988 | Japan | |
| 63-240076 | 10/1988 | Japan | |
| 1-76774 | 3/1989 | Japan | |

OTHER PUBLICATIONS

IBM Tech Discl. Bulletin, vol. 31, No. 5, Oct. 1988, pp. 40-43.
T. Furutsuka, M. Ogawa & N. Kawamura, "GaAs Dual-Gate MESFET's", IEEE Trans. Elec. Devices, vol. ED-25, pp. 580-586, Jun. 1978.
D. Rensch, D. Matthews, M. Utlaut, M. Courtney & W. Clark, Jr., "Performance of the Focused-Ion-Striped Transistor (FIST)—a New MESFET Structure Produced by Focused-Ion-Beam Implantation", vol. ED-34, pp. 2232-2237, Nov. 1987.
R. C. Clarke, "A High-Efficiency Castellated Gate Power FET", CH1959-Jun. 1983, pp. 93-111, 1983 IEEE.
N. V. Dandekar et al, "Scaling of MESFETS and HEMTS at 0.1 Micron Gate Length", SPIE vol. 1288, High-Speed Electronics and Device Scaling Conference, Mar. 19, 1990.
U, K. Mishra et al, "Low Noise 0.1 Micron GaAs MESFETS by MBE", IEEE/Cornell Conf. on Advanced Concepts in High Speed Semiconductor Devices and Circuits, Aug., 1987, pp. 177-189, IEEE Inc., New York, 1987.
P. C. Chao et al, "Electron-Beam Fabrication of GaAs Low-Noise MESFETs Using a New Trilayer Resist Technique", IEEE Trans. on Electron Devices, vol. ED-32, pp. 1042-1046, IEEE Inc., New York, Jun. 1985.

*Primary Examiner*—William D. Larkins
*Attorney, Agent, or Firm*—David W. Gomes

[57] ABSTRACT

A semiconductor device is provided of the type having a doped semiconductor region coupled to source and drain electrodes and an elongated control gate contacting the doped region along the length of the gate for forming a nonconducting depletion region across the doped region for preventing current flow therethrough with the gate having a minimized width to reduce contact area with the doped region, wherein the width of the gate is repeatedly reduced along the length thereof for further reducing contact area with the doped semiconductor region.

5 Claims, 8 Drawing Sheets

SEMICONDUCTOR DEVICE HAVING A CONTROL GATE WITH REDUCED SEMICONDUCTOR CONTACT

The present application is a continuation-in-part of application Ser. No. 07/495,877, filed Mar. 19, 1990 now abandoned.

BACKGROUND OF THE INVENTION b 1. Field of the Invention

The present invention relates generally to semiconductor devices such as metal semiconductor field effect transistors (MESFETS) and, in particular, to the gate structure used for fabricating such devices.

2. Statement of the Prior Art

Metal semiconductor field effect transistors (MESFETS) are well known and widely used in many electronic applications and are constantly subject to examination and experimentation for purposes of improving performance characteristics and construction techniques. As with many semiconductor devices, a very significant area of interest lies in high-frequency performance to allow more extensive use of the device in microwave applications. In the particular area of field effect transistors, FETS, it is known that the capacitance present between the control gate and the source electrode limits the microwave frequency performance of the device, and therefore various efforts have been undertaken to reduce this gate-source capacitance. These efforts have varied from reducing the size of the control gate to reshaping the conducting region of the semiconductor to reduce the capacitance while still providing adequate current control through the semiconductor. If the control gate is reduced too much, its ability to cut off or pinch off all current flow through the semiconductor region is compromised, thusly deteriorating performance.

For these reasons it is an object of the present invention to reduce gate-source electrode capacitance while still providing proper current regulation by the control gate.

SUMMARY OF THE INVENTION

The present invention relates to a semiconductor device of the type having a doped semiconductor region coupled to source and drain electrodes and a gate structure located adjacent to the doped region for forming a non-conducting depletion region across the doped region for preventing current flow therethrough, wherein the improvement provides the gate structure having a multiplicity of contact elements contacting the doped semiconductor region. In a refinement of the invention, the gate structure is elongated and the contact elements are in alignment in parallel with the elongated gate structure.

In another version, the present invention relates to a semiconductor device of the type having a doped semiconductor region coupled to source and drain electrodes and an elongated control gate contacting the doped region along the length of the gate for forming a nonconducting depletion region across the doped region for preventing current flow therethrough with the gate having a minimized width to reduce contact area with the doped region, wherein the improvement comprises the width of the gate being repeatedly reduced along the length thereof for further reducing contact area with the doped semiconductor region. In one refinement, the minimized width of the gate is effectively, repeatedly pinched along the length of the gate.

In yet another version, the present invention relates to a semiconductor device of the type having a doped semiconductor region coupled to source and drain electrodes, a first elongated control gate located adjacent to and extending across the doped region for forming a nonconducting depletion region across the doped region for controlling current flow therethrough between the source and drain electrodes, and a second control gate located adjacent the first control gate and the doped region, wherein the improvement comprises the first and second control gates each having a multiplicity of substantially regularly spaced contact elements contacting the doped semiconductor region. In a refinement of this version, the contact elements of the second control gate are located in alignment with spaces between contact elements of the first control gate to affect electron current flow in the doped semiconductor region as allowed by the contact elements of the first control gate. In a different refinement, the contact elements of the second control gate are located in alignment with the contact elements of the first control gate.

BRIEF DESCRIPTION OF THE DRAWINGS

The present invention is illustratively described in reference to the appended drawings of which.

DETAILED DESCRIPTION OF THE DRAWINGS

Figure 1:
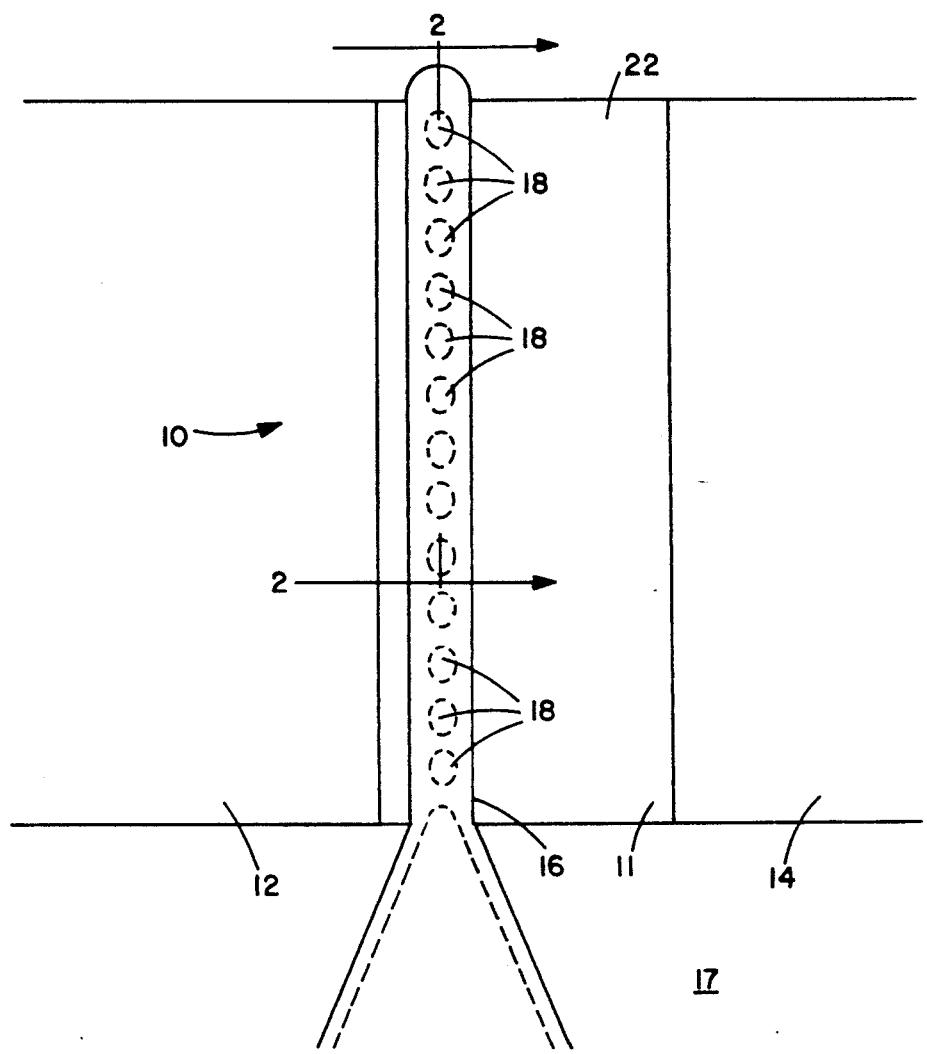
FIG. 1 is a representational top view of a MESFET constructed in accordance with one embodiment of the present invention.

FIG. 1 shows a MESFET 10 having a doped semiconductor 11 acting as the platform for a source electrode 12, a drain electrode 14 and a gate electrode 16. The doped semiconductor 11 is typically part of a larger non-conducting substrate 17 which provides overall physical support.

The gate electrode 16 is shown as an elongated structure located adjacent to the doped semiconductor 11 along the semiconductor's top surface 22 and having a multiplicity of contact elements 18 which physically and electrically contact the top surface 22. The contact elements 18 are shown by shadow lines representing the specific contact area formed between the gate electrode 16 and the doped semiconductor 11. The contact elements 18 are in general alignment in parallel with the elongated gate structure and are approximately uniform and regularly spaced across the entire width of semiconductor 11. This contact element structure reduces the source-gate capacitance by reducing the contact area between the control gate 16 and the doped semiconductor 11 while still providing proper control over current flow through semiconductor 11.

Figure 2:
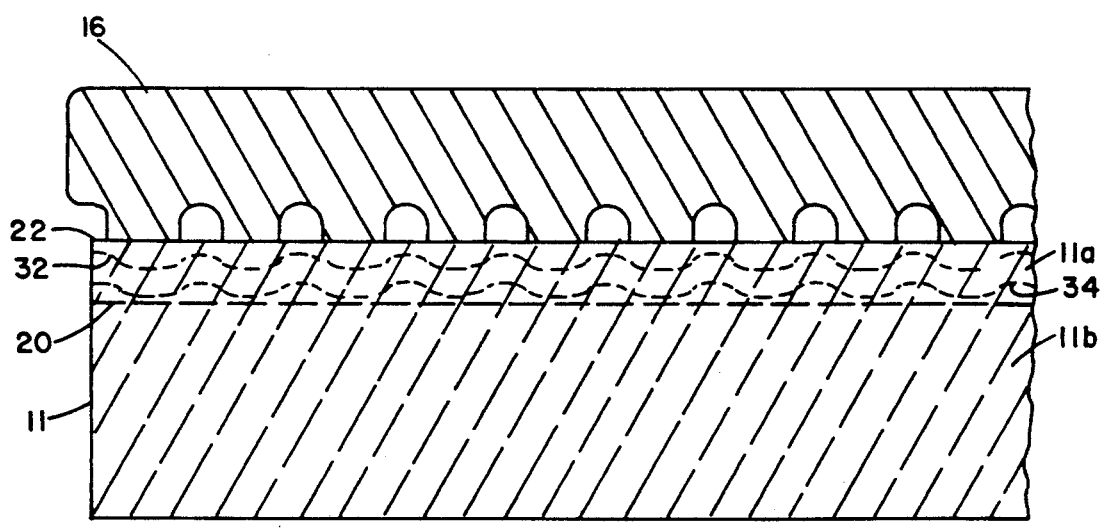
FIG. 2 is a sectional view of the embodiment of FIG. 1 taken along view lines 2—2.

FIG. 2 shows a cross-sectional view of the gate electrode 16 and the semiconductor 11. Semiconductor 11 is demarcated by a dotted line 20 above which the semiconductor material 11a contains doping ions and is therefore conductive and below which line 20 the semiconductor material 11b is undoped, and thus non-conducting.

Semiconductor 11 and gate electrode 16 may be constructed of any suitable materials. By way of example, the semiconductor 11 may be constructed using a gallium arsenide (GaAs) substrate having a total height of approximately 125 microns with a doped portion 11a reaching a depth of approximately 0.15 microns. FIG. 2 is out of proportion with respect to these measurements for purposes of clarity and demonstration.

Figure 2A:
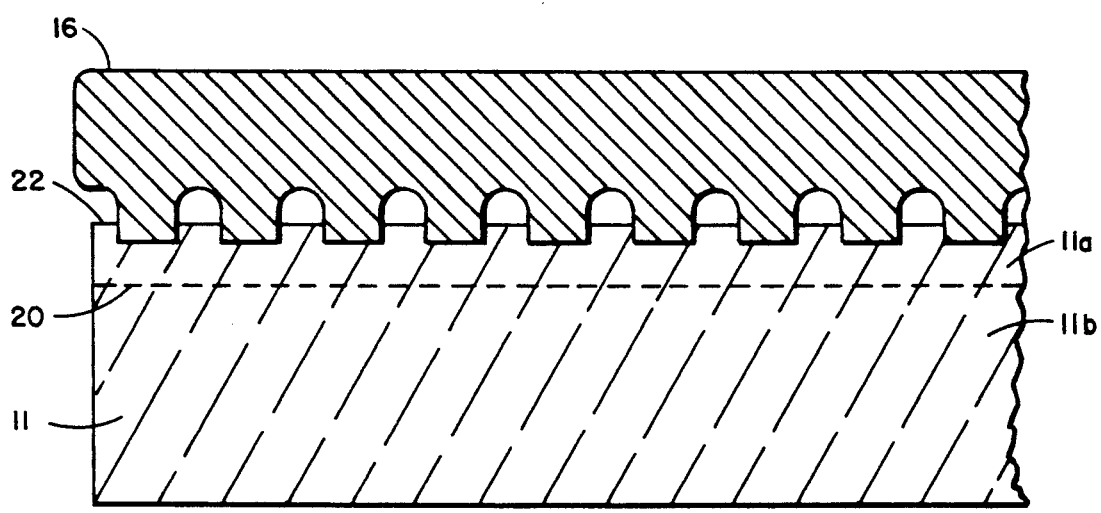
FIG. 2A is an alternate sectional view of the embodiment of FIG. 1 taken along view lines 2—2.

FIG. 2A shows the effect of a recess etch for contact elements 18. The gate semiconductor contact is very often achieved by first etching the doped semiconductor in the areas where the gate will be in contact. This is known as gate recess etching, and causes implantation of the contacts 18 into the surface 22 to a depth of 0.05 to 0.07 microns for the examples discussed herein. There is ongoing effort in the industry to reduce the need for gate recess etching or at least the depth of the recess, because it causes non-uniformity in fabrication.

The doped region 11a may be created by several methods, one of which includes the implantation of silicon ions by means of accelerating them with a high voltage electrical field. This known method accelerates the silicon ions with a voltage of approximately 100,000 electron volts causing the ions to impact the surface and be implanted at various depths below the surface 22. After such implantation, the semiconductor is heated to a temperature sufficient to cause recrystallization of the structure which results in the placement of the silicon ions within the GaAs lattice structure. This ion implantation process generally causes a density of ions within the GaAs which varies in accordance with the depth from the top surface 22. This variation of ion density with depth is described in greater detail below.

Another example of a process for constructing the semiconductor 11 with ion doping is generally known as MOCVD (Metal Organic Chemical Vapor Deposition) or OMVPE (OrganoMetallic Vapor Phase Epitaxy) wherein "carrier gases" bring gallium, arsenic and silicon containing molecules into a reaction chamber, causing deposition of high quality crystalline films of semiconductor on the selected substrates. Yet another example is the MBE (molecular beam epitaxy) process which accomplishes similar results using only pure forms of the in the form of "molecular fluxes" by heating the individual basic ingredients (Ga, As and Si). These elements are produced element sources. These two processes, and especially the last one, are generally more costly than electrically accelerated ion implantation. However, they allow a significant amount of control over the ion density of the semiconductor with respect to depth from the surface 22. The above material preparation techniques are already in use with conventional gate electrode structures, producing devices having good performance characteristics. The devices so constructed are known as "spiked doped" or "pulse doped" MESFETS.

Figure 3:
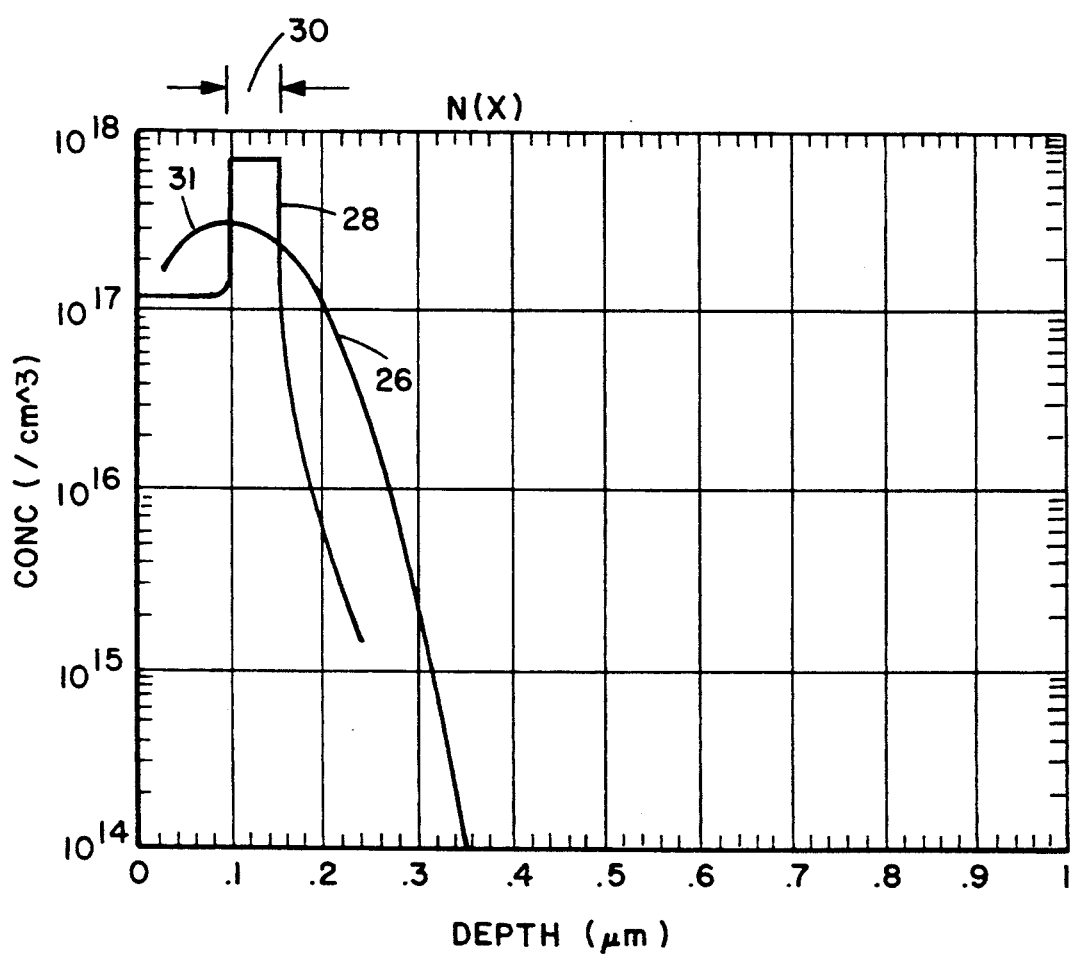
FIG. 3 is a graphical representation of ion doping density with respect to depth for two different types of semiconductors intended for use with the present invention.

FIG. 3 shows a graph of ion density versus distance from the top surface 22 or depth within the semiconductor 11 produced by the two methods discussed above. The vertical axis indicates the ion density in ions per cubic centimeter and the horizontal axis indicates depth in microns. The gaussian shaped bell curve 26 demonstrates the ion density created by the electrically accelerated implantation process, wherein the density starts out at less than $1 \times 10^{17}$ ions per cubic centimeter near the surface 22 and increases to a level of $4 \times 10^{17}$ ions per cubic centimeter at a depth of approximately 0.1 micron from the surface 22. The pulse shaped curve 28 demonstrates the density distribution which may be achieved with the MBE process. This process can be used to form a highly doped sheet of semiconductor material having a thickness 30 in a range from less than 0.01 microns to 0.05 microns.

Referring back to FIG. 2, the process by which current flow through the doped semiconductor 11 is controlled is as follows. An electrical potential is applied through the metallized gate electrode 16, which electrical potential causes electrons in the region around the contact elements 18 to be withdrawn therefrom to create a depletion region in the doped semiconductor 11a. The absence of electrons in this depletion region prevents the flow of electron current therethrough.

Even in the unbiased condition a minor depletion region is created near the top surface 22 of the semiconductor 11. This depletion region is caused by a natural surface voltage of approximately 0.6 volts for GaAs and also by a Schottky barrier voltage in the range of 0.7 to 0.8 volts generated by the bonding of the titanium gate electrode 16 with the GaAs. The electrical potentials so created along the surface 22 cause an unbiased depletion region to be formed which is estimated to take the shape of the curved line 32.

As an electrical potential is applied to the gate electrode 16 and increased, the depletion area around the contact elements 18 is enlarged and reaches more deeply into the doped semiconductor, as might be represented by the curved line 34, until it has depleted all of the electrons across the width of the doped region 11a and thereby cut off current flow therethrough.

It should be noted that this description of the depletion area created by the contact elements 18 is intended to be very general. The actual shape of the depletion area can be significantly affected by a variety of factors. As previously mentioned, recess etching is often used to implant the gate structure beneath the top surface of the doped semiconductor region. The amount of recess etching or implantation used varies with the construction process of the doped semiconductor and the application and is preferably reduced as much as possible. The largest amount of recess required by the processes described herein is on the order of 0.07 microns for the ion implantation technique. This amount of recess will obviously affect the shape of the unbiased depletion region and its pattern of growth to current pinch off.

In order to achieve proper control of the depletion area for any given application it is necessary to consider both the amount of recess etch used and the doping density of the material. In FIG. 2A, by way of example, if 0.07 microns of recess were used with ion implanted semiconductor, the contact surface 31a with the control gate would be located in the highly doped region indicated at point 31 on the bell curve 26 of FIG. 3. Under this condition, the Schottky barrier voltage of 0.7 volts would create an unbiased depletion area of 0.05 microns. Thus the specific design application must take into account the factors of recess and ion density profile.

One consideration for the present embodiment is that the semiconductor be relatively lightly doped near the surface 22 so that the natural surface voltage and the Schottky barrier voltage can form a significant unbiased depletion area. As bias voltage is then applied to the gate electrode, the depth of the depletion area begins to extend into the high ion density portion of the semiconductor. In this manner it is the initial biasing voltage which begins to effect the highest ion density portion of the semiconductor and thus immediately begins cut-off of the most substantial current carrying portion of the semiconductor. The drop off in ion density at greater depth thus enables cut-off of the transistor using a limited maximum voltage.

Figure 4:
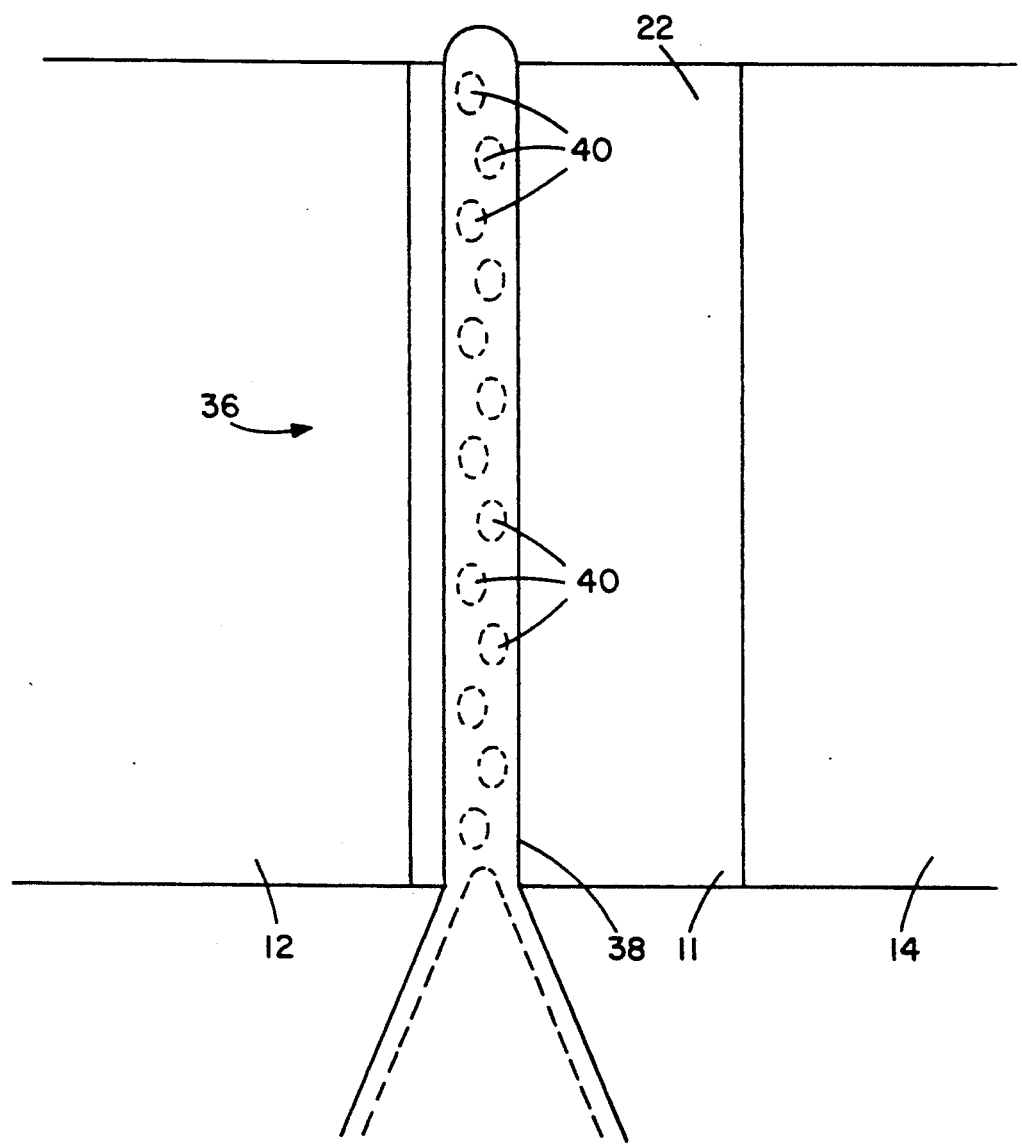
FIG. 4 is a representational top view of a MESFET constructed in accordance with another embodiment of the present invention.

FIG. 4 shows a semiconductor device 36 constructed in accordance with another embodiment of the present invention. Individual elements which are numbered identically to those in FIG. 1 may be considered to be identical to those of FIG. 1. The device 36 includes the same substrate, source electrode 12 and drain electrode 14 as the embodiment of FIG. 1 along with a different gate electrode 38. Gate electrode 38 is shown having a multiplicity of contact elements 40 in electrical contact with the top surface 22 of the semiconductor 11. The contact elements 40 are configured somewhat differently from the contact elements 18 of electrode 16 in that they are alternately laterally displaced with respect to the elongated structure of gate 38. This structure results in the same general contact area between the gate 38 and the top surface 22 along with the same average distance between the source electrode 12 and the contact elements 40 as would be provided by the device of FIG. 1. However, the alternate lateral displacement of contact elements 40 provides the gate electrode 38 with greater mechanical stability with respect to the doped semiconductor 11. This greater stability has the present potential of allowing construction of contact elements 40 which are physically smaller than the contact elements 18 of gate 16. This arrangement thus enables construction of a gate having either a smaller contact area with the semiconductor and thus a lower source gate capacitance, the same source gate capacitance but greater mechanical stability and thus reliability, or even a combined intermediate improvement for both the capacitance level and mechanical stability.

Figure 5:
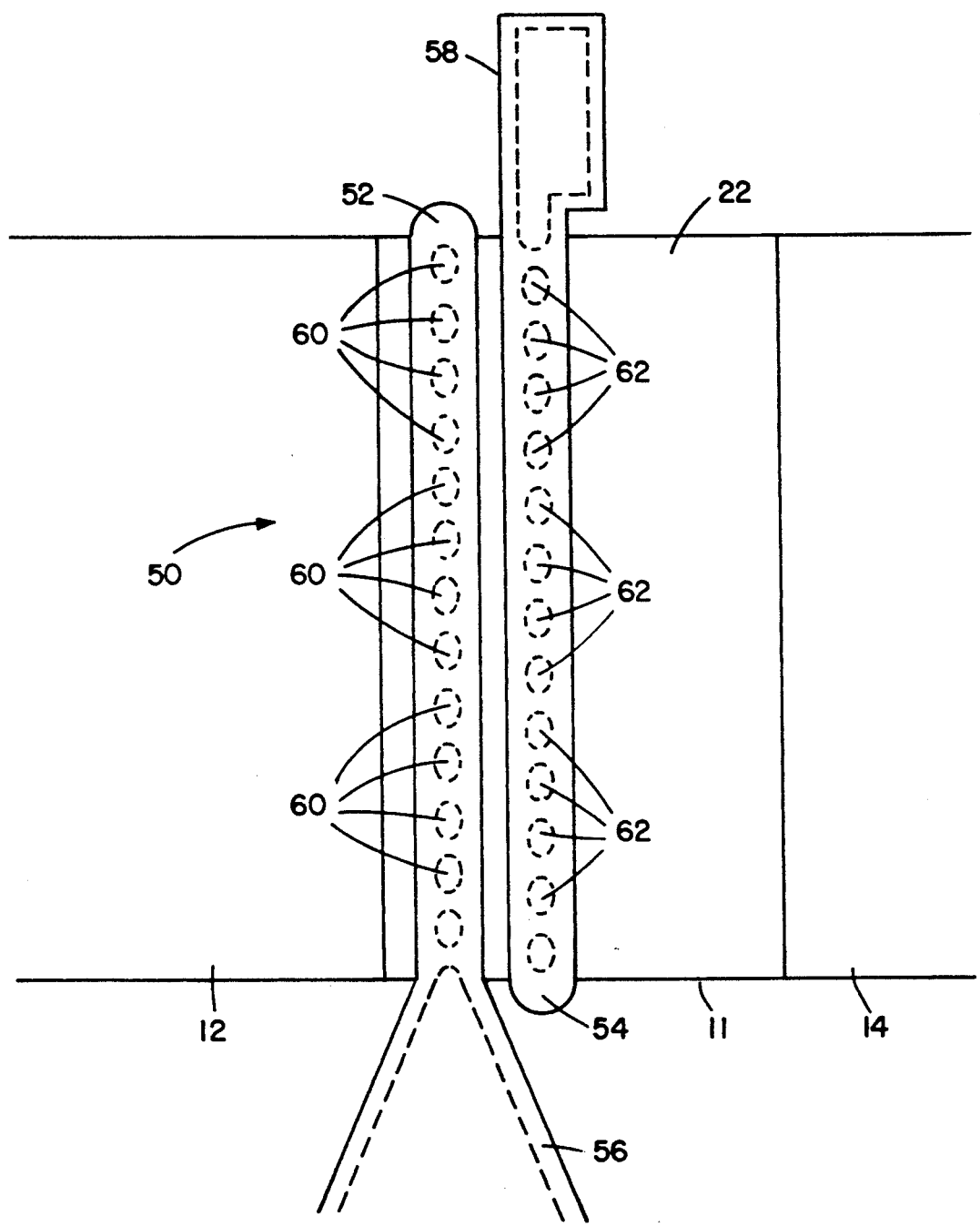
FIG. 5 is a representational top view of a dual gate MESFET constructed in accordance with yet another embodiment of the present invention.

FIG. 5 shows a dual gate MESFET 50 constructed in accordance with the present invention. Individual elements which are numbered identically to those in FIG. 1 may be considered to be identical to those of FIG. 1. MESFET 50 includes a pair of gate electrodes 52 and 54 which are in physical and electrical contact with the top surface 22 of the semiconductor 11 and generally located between the source electrode 12 and the drain electrode 14. The gate electrodes 52 and 54 have connection and support pads 56 and 58, respectively, which approach the semiconductor 11 from opposite sides for the purpose of avoiding interference therebetween.

Control gates 52 and 54 each includes a multiplicity of separate contact elements 60 and 62, respectively, which make the actual contact with the top surface 22.

As the MESFET 50 is a dual gate device, the first control gate 52 performs the same RF switching function as would normally be provided by the control gate of a single gate device and the second control gate 54 provides a screening function in the same manner as the second gate of a tetrode. This screening function blocks feedback capacitance between the drain electrode 14 and the control gate 52. As the control gate 54 handles only a DC bias and feedback signals, its structure may be smaller than that of gate 52 in terms of RF current carrying capability.

It should be specifically noted that the contact elements 62 of gate 54 are located in alignment with the spaces between the contact elements 60 of control gate 52 and further that control gate 54 is located in relative close proximity to control gate 52. In one embodiment, the contact elements of both control gates have a center-to-center spacing of 0.5 microns, a contact element width of 0.35 microns in the elongated direction of the gate and an intergate spacing of 1 micron. This spacing is believed to cause a channeling of conductive electrons into the spacing between the contact elements 60 of gate 52 and subsequent control of those electrons through the contact elements 62 in alignment therewith. The gate 54 thereby controls the size of the conduction channel so that the control gate 52 is more effective.

Figure 9:
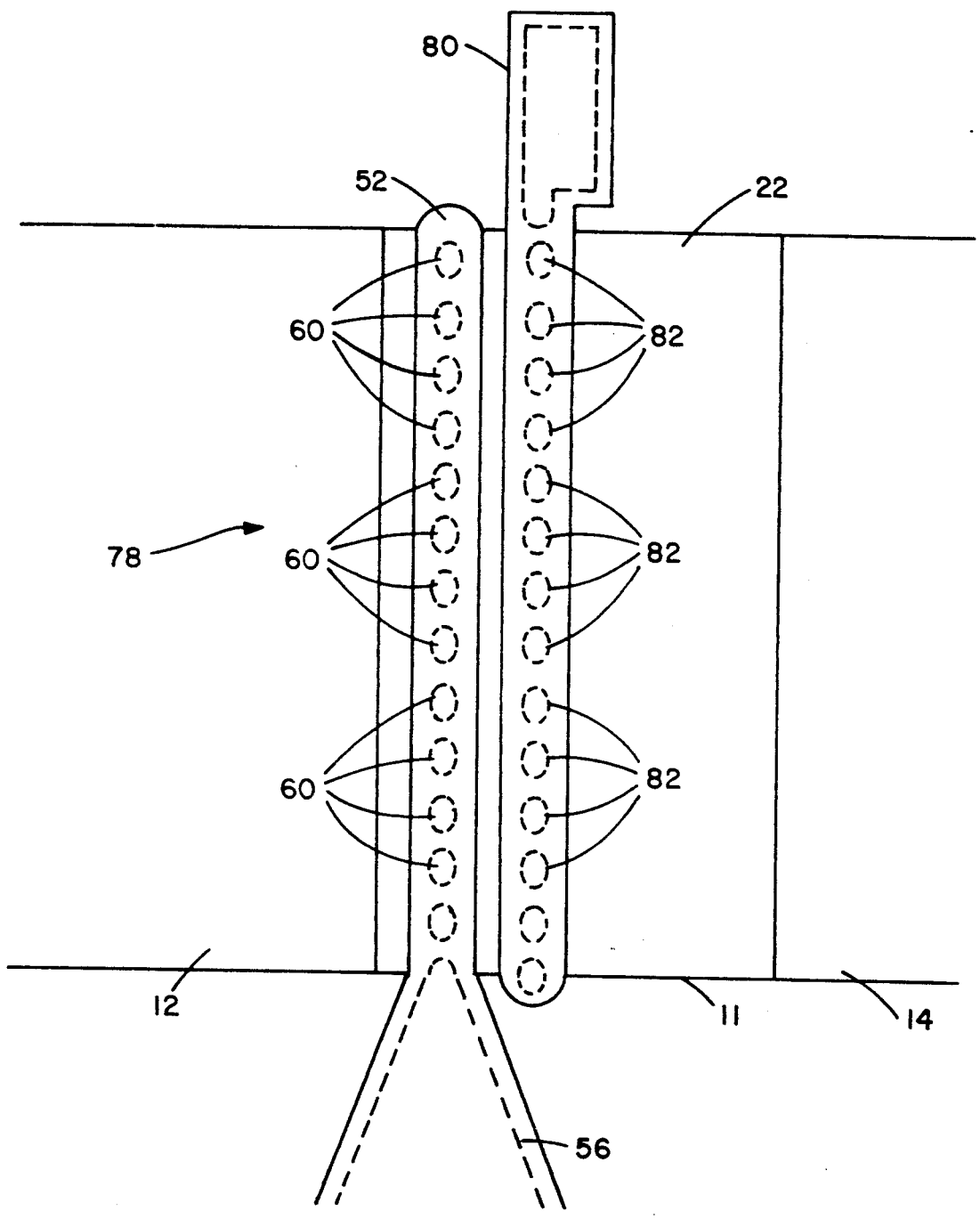
FIG. 9 is a representational top view of a MESFET constructed in accordance with another embodiment of the present invention.

FIG. 9 shows an alternate embodiment of the dual gate structure of FIG. 5 wherein like components are labeled with the same reference number. In this embodiment 78, the first control gate 52 remains the same as FIG. 5, but the second control gate 58 of FIG. 5 is replaced by a control gate 80. Control gate 80 is elongated in the direction across the substrate 11 and includes a multiplicity of contact elements 82 which are physically and electrically connected to substrate 11 for the purpose of affecting current flow therethrough. Control gate 80 differs from previous embodiments in that the contact elements 82 are located in alignment with the contact elements 60 of control gate 52. By this arrangement, control gate 80 may be used to enhance the current flow directly beneath the contact elements 60 by the application of a proper bias voltage, positive in the described embodiments, to the control gate 80. By this arrangement, the current flow directly beneath contact elements 60 is enhanced which provides the contact elements 60 with a greater effect on current flow under biased conditions. This enhancement effectively embeds the contact elements 60 deeper into the high ion density portion of the doped region and improves the transconductance of the device by increasing the change in current flow for any given change in gate voltage. Whereas the second control gate 58 of FIG. 5 could be biased to restrict current flow through the depletion region located beneath the space between contact elements 60, the contact elements 82 are used to enhance current flow directly beneath contact elements 60. This enhancement might be improved by constructing the contact elements 82 to have a dimension in the elongated direction of gate 80 which is smaller than the corresponding dimension of contact elements 60. In this manner, it is more certain that the current enhancement effects will be produced more under the contact elements 60 and less beneath the spaces between contact elements 60.

Figure 6:
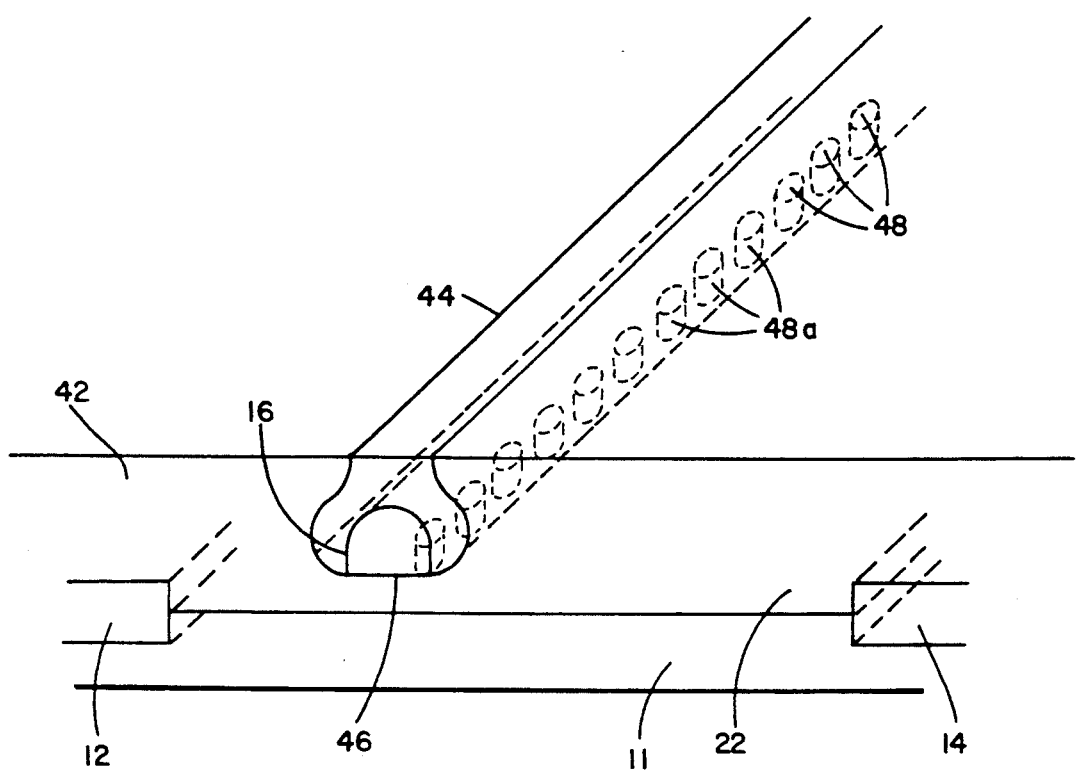
FIG. 6 is a sectional view of a fabrication technique which may be used for constructing a device in accordance with the present invention.

The gate structure of the present invention may be fabricated by the use of known techniques with certain modifications. The known technique is the E-Beam resist liftoff metallization process which is described in reference to FIG. 6. Generally a blanket of known photoresistive material 42 usually consisting of two or more layers of varying sensitivity is applied to the substrate 11 along the surface 22. A computer controlled electron beam is then used to expose the material 42 in the shape of the channel 44. In the production of known gate structures, the channel 44 would include a centrally located trench at the bottom 46 of channel 44, which trench would be continuous for the length of the gate structure along the top surface 22. For the present invention the photoresist 42 is additionally exposed at a series of spots 48 extending to the top surface 22. It should be noted that during exposure the photoresist material 42 maintains its integrity and the channel 44 is not yet formed.

After exposure, the photoresistive material 42 is developed resulting in the formation of a physical channel 44. Channel 44 includes throughholes 48a which extend to the top surface 22 of the conductor 11. At this point, recess etching may be performed on the top surface 22 of the doped gallium arsenide as exposed by the throughholes 48a. The substrate 11 bearing the material 42 is then inverted and a layer of titanium or other suitable metal is evaporated in an upward direction to condense on the downwardly facing surface of the photoresist 42, filling the throughholes 48 to form contact elements 18 and forming the control gate 16, partially shown in shadow, interconnecting the elements 18. After metallization, the photoresistive material 42 is etched away resulting in removal of all of the titanium except for gate structure 16 and the individual contact elements 18.

Figure 7:
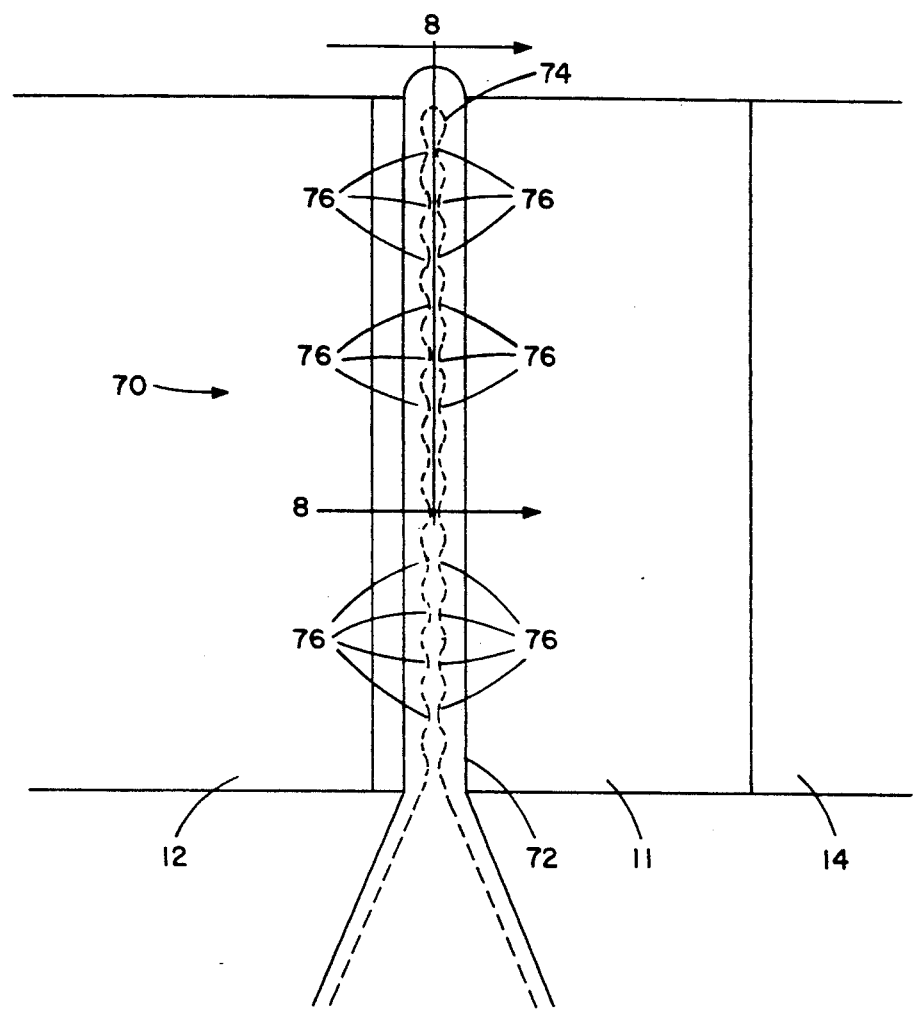
FIG. 7 is a representational top view of a MESFET constructed in accordance with still another embodiment of the present invention.
Figure 8:
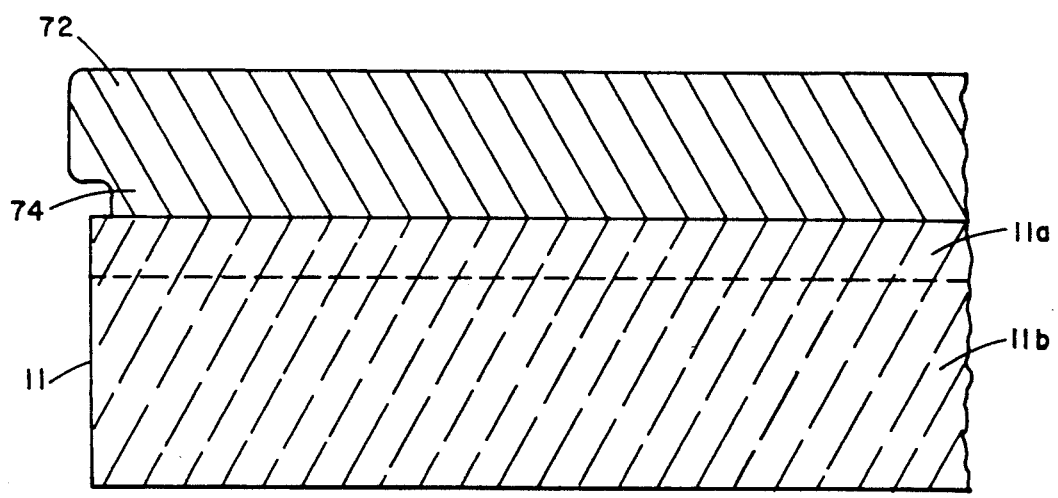
FIG. 8 is a sectional view of FIG. 7 taken along view line 8—8.

FIG. 7 shows another embodiment of the present invention in the form of a MESFET 70 having a control gate 72 which is repeatedly reduced in width along its length in order to minimize the contact area with the doped semiconductor 11 and thereby reduce gate source capacitance. The elongated gate 72 is constructed with a contact area 74 which is first minimized in width to the resolution limitations of the fabrication process and the application stress demands and then further repeatedly reduced in width along its length to further reduce its contact area with the doped semiconductor 11. In the embodiment shown, these repeated reductions in width take the form of effectively pinching the width of the contact area 74. As shown the reductions 76 in width on either side of the contact area 74 may be in alignment or optionally may be out of alignment to thereby form a contact area 74 which wiggles along the length of the gate 72. Further, the width reductions 76 are shown as being regularly spaced along the length of gate 72 but may optionally be irregularly spaced such as the effect of a poorly controlled manufacturing process.

This version of the present invention may be easily constructed in accordance with the fabrication techniques identified for the other embodiments by simple variations in the exposure process for the photoresist material. By way of example, the throughholes 48 of FIG. 6 may be exposed to the smallest fabrication size suitable for gate integrity and may be spaced along the elongated direction of the gate so that they slightly overlap, thus producing a continuous footprint gate as shown in FIG. 7.

Conclusion

The present invention provides a variety of semiconductor devices having improved performance characteristics based upon reductions in the source-gate capacitance. In the microwave frequency range, this reduced capacitance results in higher operating speeds for the device. The reduced capacitance may also be used to provide higher gain at any given microwave frequency. These characteristics may be specified to some degree as an improvement in the figure of merit $F_t$ which is directly proportional to the transconductance and inversely proportional to the source-gate capacitance. The improvement may also be thought of as a reduction in the "effective gate length" which corresponds to the width of the control gate measured in the direction between the source and drain electrodes. Further, the present invention enhances the effective resolution limits of the E-beam fabrication technique by reducing the effective gate length. Still further the present invention overcomes the reliability limitations of gate length in the range of 0.15 microns and below. This design makes effective use of the "mushroom head" design which provides a lower gate resistance for the RF control signal while still providing a small contact area with low capacitance and good reliability.

It should be understood that the embodiments of the present invention described above are intended to be taken in an illustrative and not a limiting sense. Various modifications and changes may be made to the above embodiments by persons skilled in the art without departing from the scope of the present invention as defined by the appended claims. By way of example, although the embodiments herein describe MESFETS, it is also intended to apply the gate structure of the present invention to other devices such as high electron mobility transistors (HEMTs).

What is claimed is:

1. In a semiconductor device of the type having a doped semiconductor region coupled to source and drain electrodes with a surface extending therebetween and a control gate located adjacent to and extending across the doped region along the surface thereof for forming a nonconducting depletion region across the doped region for controlling current flow therethrough between the source and drain electrodes, wherein the improvement comprises:

the doped region having an approximately known density of doping ions which density increases to a maximum and then decreases to a minimum in accordance with increasing distance from the surface of the doped region; and the control gate having a multiplicity of regularly spaced contact elements contacting the doped semiconductor region along the surface thereof, wherein an unbiased depletion region is formed in the doped semiconductor region at the contact elements, which unbiased depletion region extends only to the maximum density of doping ions.

2. The improvement of claim 1, wherein the doped semiconductor region includes gallium arsenide doped with silicon by an electrically accelerated ion implantation technique.

3. In a semiconductor device of the type having a doped semiconductor region coupled to source and drain electrodes and a control gate located adjacent to and extending across the doped region for forming a nonconducting depletion region across the doped region for controlling current flow therethrough between the source and drain electrodes, wherein the improvement comprises:

the control gate being elongated in the direction across the doped region and having a multiplicity of substantially regularly spaced contact elements, wherein the contact elements contact the doped semiconductor region along the elongated direction of the control gate and are alternately displaced laterally with respect to the elongated direction of the control gate and in a direction between the source and drain electrodes.

4. In a semiconductor device of the type having a doped semiconductor region coupled to source and drain electrodes, a first elongated control gate located adjacent to and extending across the doped region for forming a nonconducting depletion region across the doped region for controlling current flow therethrough between the source and drain electrodes, and a second control gate located adjacent the first control gate and the doped region, wherein the improvement comprises:

the first and second control gate each having a multiplicity of substantially regularly spaced contact elements contacting the doped semiconductor region with the contact elements of the second gate located in alignment with spaces between contact elements of the first gate to affect electron current flow in the doped semiconductor region as allowed by the contact elements of the first gate.

5. The improvement of claim 3, wherein the contact elements are alternately aligned along a pair of imaginary lines parallel to the elongated direction of the gate.

* * * * *